United States Patent [19]
Baynes et al.

[11] Patent Number: 6,145,584
[45] Date of Patent: Nov. 14, 2000

[54] POWER EQUIPMENT FOR USE UNDERWATER

[75] Inventors: Graham Tolhurst Baynes; Christopher Rodwell, both of Leicester, United Kingdom

[73] Assignee: Alstom UK Ltd., Rugby, United Kingdom

[21] Appl. No.: 09/269,283

[22] PCT Filed: Sep. 11, 1997

[86] PCT No.: PCT/GB97/02481

§ 371 Date: Jun. 23, 1999

§ 102(e) Date: Jun. 23, 1999

[87] PCT Pub. No.: WO98/13838

PCT Pub. Date: Apr. 2, 1998

[30] Foreign Application Priority Data

Sep. 26, 1996 [GB] United Kingdom ............... 9620252

[51] Int. Cl.[7] .................................................. F28D 3/00
[52] U.S. Cl. ............... 165/45; 165/104.33; 165/107.19; 361/385
[58] Field of Search ................. 165/80.3, 185, 165/104.19, 104.21, 104.33, 45; 361/385, 384; 376/282

[56] References Cited

U.S. PATENT DOCUMENTS

| | | |
|---|---|---|
| 1,471,263 | 10/1923 | Hobart . |
| 3,503,025 | 3/1970 | Weinfurt ............................. 165/104.33 |
| 3,713,060 | 1/1973 | Harlow . |
| 4,260,014 | 4/1981 | Feehan ............................... 165/104.33 |
| 4,375,157 | 3/1983 | Boesen ............................... 165/104.21 |
| 4,564,061 | 1/1986 | Rauth et al. ....................... 165/104.33 |
| 4,566,529 | 1/1986 | Klein .................................. 165/104.33 |
| 4,587,079 | 5/1986 | Fajeau et al. ............................ 376/282 |
| 4,619,316 | 10/1986 | Nakayama et al. ................ 165/104.33 |
| 4,781,029 | 11/1988 | SerVass .................................. 60/641.7 |
| 4,794,982 | 1/1989 | Corkigian ........................... 165/104.33 |
| 5,000,252 | 3/1991 | Faghri . |
| 5,048,598 | 9/1991 | Takemae et al. .................. 165/104.33 |
| 5,092,748 | 3/1992 | Simmons, II . |
| 5,195,577 | 3/1993 | Kameda et al. ................... 165/104.33 |

FOREIGN PATENT DOCUMENTS

| | | |
|---|---|---|
| 0 040 651 | 12/1981 | European Pat. Off. . |
| 0 493 704 | 7/1992 | European Pat. Off. . |
| 1 108 775 | 6/1961 | Germany . |
| 368 816 | 6/1963 | Switzerland . |
| 1 604 978 | 12/1981 | United Kingdom . |

*Primary Examiner*—Ira S. Lazarus
*Assistant Examiner*—Terrell McKinnon
*Attorney, Agent, or Firm*—Venable; Robert J. Frank

[57] ABSTRACT

Power equipment, e.g. in the form of an electrical substation, for use underwater incorporates heat exchange equipment for dissipation of heat to the surrounding water. The equipment may utilise a casing having a hollow tubular element (50) extending therethrough or may utilise an arrangement with two chambers (111, 112) between which a fluid is circulated.

23 Claims, 4 Drawing Sheets

POWER EQUIPMENT FOR USE UNDERWATER

FIELD OF THE INVENTION

This invention is concerned with power equipment for use underwater, e.g. under the sea, such power equipment incorporating at least one power device.

In the context the term 'power device' is to be interpreted generally as covering all forms of prime movers, e.g. engines, as well as power transmission devices (e.g. mechanical, electrical, pneumatic, hydraulic), but the invention is particularly applicable to power equipment incorporating a power device in the form of an electrical sub-station incorporating a transformer and its associated control gear.

BACKGROUND OF THE INVENTION

Power equipment incorporating such power devices will always produce energy in the form of heat and it is necessary for heat to be removed from the equipment, e.g. by conduction, convection or radiation.

At first sight it might appear that for power equipment used underwater there would be no particular cooling problem since the water itself would provide a large heat sink. However, for certain equipment producing relatively large quantities of heat it will be necessary to take special and specific measures to ensure efficient and effective removal of heat from the power equipment into the surrounding water. Moreover, maintenance and repair operations of equipment used underwater is time-consuming and expensive, and there is a need to ensure that such equipment can operate with long maintenance intervals.

The object of the invention is to provide power equipment with an efficient cooling arrangement which will operate in an underwater location and without attention for long periods of time.

SUMMARY OF THE INVENTION

According to one aspect of the invention there is provided power equipment for use when submerged in water, the power equipment comprising an exterior casing enclosing at least one power device of a type which produces heat when in use, the exterior casing being in heat exchange relationship with the at least one power device so as to put the at least one power device into heat exchange relationship with water surrounding the exterior casing when the power equipment is submerged, characterised in that the power equipment further comprises a passage penetrating the exterior casing and extending at least partially through the power equipment in heat exchange relationship with the at least one power device, which passage is open to ingress of the water surrounding the exterior casing so as to put the at least one power device into heat exchange relationship with water in the passage when the power equipment is submerged.

In a preferred embodiment the passage is provided by a substantially tubular element extending through the casing which passage is open at at least one end; preferably the substantially tubular element is of circular cylindrical form and is open at both ends.

It is envisaged that the substantially tubular element may be mounted for limited axial movement in the casing; with such an embodiment shock absorbing means may be provided to limit and/or control movement of the substantially tubular element.

At least one heat sink may be mounted in the casing adjacent to the passage to take up heat by conduction from within the casing.

Furthermore, a heat sink may be provided to discharge heat to the surrounding water, the heat sink being mounted on either the tubular element or the casing.

The casing may incorporate at least one array to take up convection heat; such an array of cooling vanes may be attached to said tubular element.

Furthermore, the or an array of cooling vanes may be mounted on the inner surface of the casing.

The casing may contain a fluid which, in use, circulates therein by natural circulation and/or by forced circulation.

According to a further aspect the invention provides power equipment for use underwater, the power equipment comprising a pressure vessel having a first chamber in which at least one power device (as hereinbefore defined) which produces heat, in use, is mounted and a second chamber at least partially filled with a fluid, the second chamber being in heat conductive relationship with the power device and also having a wall in contact with the water surrounding the power equipment, whereby heat produced by the power device is transmitted to the second chamber and thence transmitted to the surrounding water.

The fluid in the second chamber may be a liquid, e.g. water.

The second chamber may be connected to a volume compensating means to which liquid may flow from the second chamber or vice versa.

In a further embodiment the second chamber is only partially filled with liquid and a volume is defined in the second chamber above the liquid; the volume above the liquid may be connected to an evacuation means actuatable to reduce the pressure in said volume.

It is also envisaged that the second chamber may be connected by conduit means with a heat exchange arrangement which is disposed adjacent the power device; the first chamber may have a volume containing a further fluid and the heat exchange arrangement may comprise a coaxial-tube arrangement for the flow of said further fluid therethrough. Further the coaxial-tube arrangement may comprise an outer tube extending outwardly from the first chamber and in contact with said surrounding water and an inner tube disposed within the outer tube and terminating at one end within the first chamber near to the power device, said further fluid during use of the power equipment being caused to flow first inside the inner tube and then between the outer and inner tubes.

The second chamber may have a domed element whose exterior domed surface provides the wall in contact with the surrounding water for the transfer of heat thereto from the fluid in the second chamber, and the surface of the domed element in contact with the water may be formed with corrugations, vanes or ribs.

Movement of the fluid in the power equipment may occur by means of natural circulation and/or by forced circulation.

BRIEF DESCRIPTION OF THE DRAWINGS

Embodiments of the invention will now be described, by way of example, with reference to the accompanying drawings, in which.

DESCRIPTION OF PREFERRED EMBODIMENTS

The equipment will normally be fixedly positioned underwater, and in such a circumstance it could be attached to a structure such as an off-shore drilling rig but it is particularly envisaged that it will be located on the sea-bed.

Figure 1:
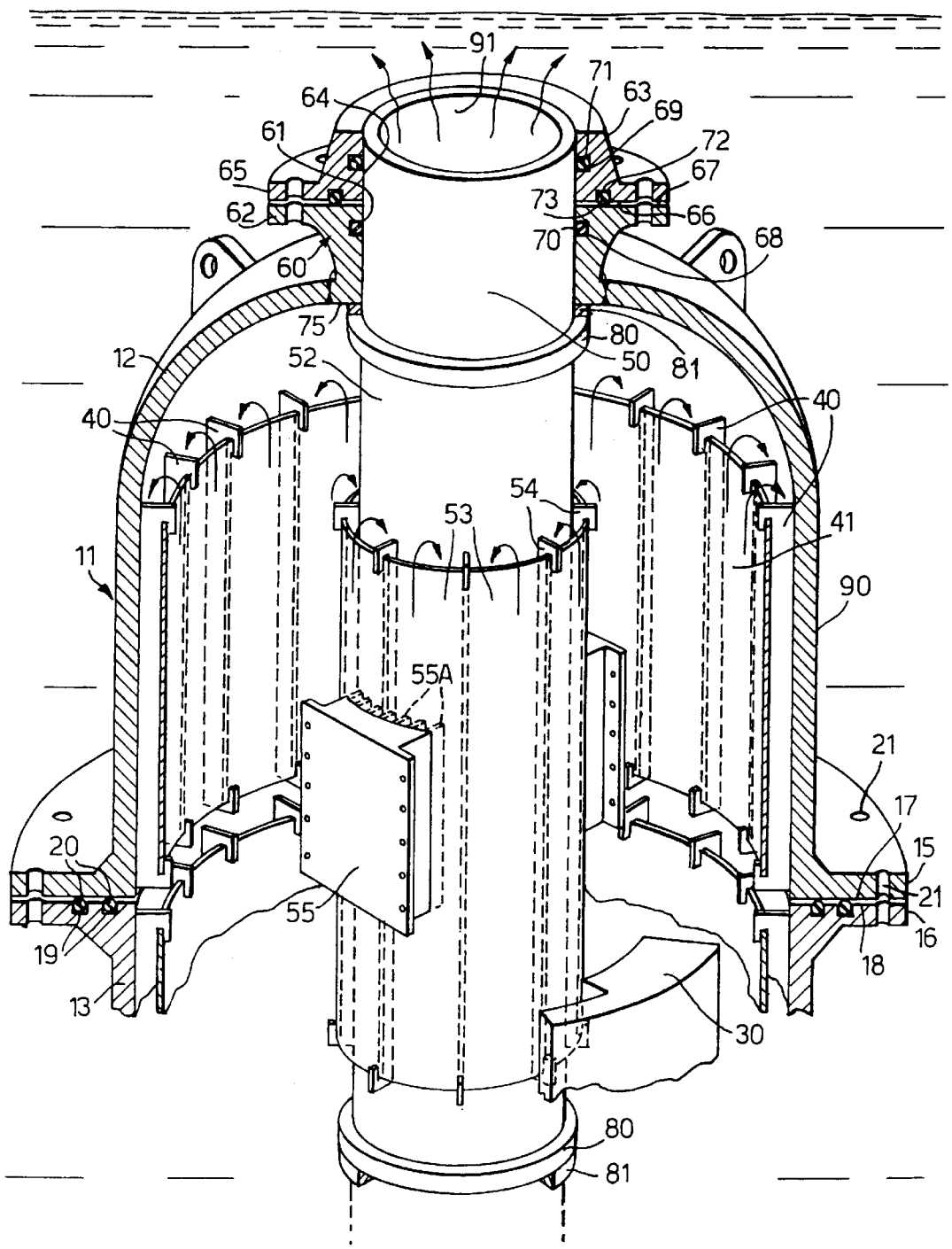
FIG. 1 shows a section through power equipment adapted for use in an underwater, especially an undersea, location.

The equipment 10 as illustrated in FIG. 1 comprises a casing 11 adapted to be positioned underwater in the position illustrated being constructed to withstand extremely high pressures; operation at depths of 300 metres or more is envisaged. The casing 11 comprises a top half-shell 12 and a bottom half shell 13 abutting at respective flanges 15, 16. The half-shells 12, 13 are essentially symmetrical apart from the formation of abutting radially extending surfaces 17, 18 thereof As shown, surface 18 is formed with annular grooves 19 of channel-section for receiving sealing O-rings 20 and both flanges are formed with bores 21 (threaded, if appropriate), to receive fastening elements, e.g. screws or bolts. Other forms of sealing and fastening arrangements at the flanges are possible, e.g. the sealing grooves and O-rings may be formed in upper flange 15.

The casing 11 thus formed encloses and supports at least one power device referenced diagrammatically as at 30 which produces and/or transmits power and also produces heat. Such device (comprising e.g. electrical transformer equipment) will have suitable connections, e.g. power lines to a base location, e.g. a fixed ship, off-shore installation or the shore and/or to load equipment; the connections extend through the casing 11 via suitable sealed apertures (not shown).

The device 30 will be mounted in such a way that the heat produced thereby is dissipated from the device 30 by cooling means.

The casing 11 has contained therein a cooling fluid which will usually be a gas such as air or nitrogen. The gas may be pressurised but will normally be at or near atmospheric pressure. Around the inner surfaces of each half-shell 12, 13 of the casing 11 are arranged an annular array of cooling vanes 40 which take up convection heat from the gas. To the vanes 40 is affixed a cylindrical fibre sheet insulating element 41 which itself is held at a distance from the inner surface of the respective half-shells by the vanes 40 which also act as spacers. The element 41 may be made of separate baffle elements affixed together.

The cooling means also comprises a substantially tubular element 50 which acts to provide a passage extending axially through the casing 11, the tube 50 being open ended at at least one end so that the surrounding water can flow thereinto and therefrom. It is arranged that the tubular element 50 is mounted for limited axial movement in casing 10.

Around the radially outer surface 52 of the tube 50 is positioned one or more cylindrical or part-cylindrical insulating elements 53 formed of fibre sheet or similar. These are held in position by cooling vanes 54, which also take up convection heat from the gas in the casing. Also affixed to surface 52 is at least one relatively large heat sink 55 to take up a large proportion of the heat produced by the equipment 30 for eventual conduction through the tube 50.

The size and location of the heat sink(s) 55 will be determined in the light of the size and form of the device 30 and the amount of heat expected to be produced thereby; and it is particularly envisaged that the heat sink is mounted directly to the heat producing equipment and thence to tubular element 50. In the circumstance the heat from the baseplate of such equipment is transferred directly through heat sink 55 to the water in tube 50.

Further the heat sink 55 may be provided with a plurality of radially inwardly extending elongated vanes or ribs 55A which assist in the dissipation of heat.

Figure 2:
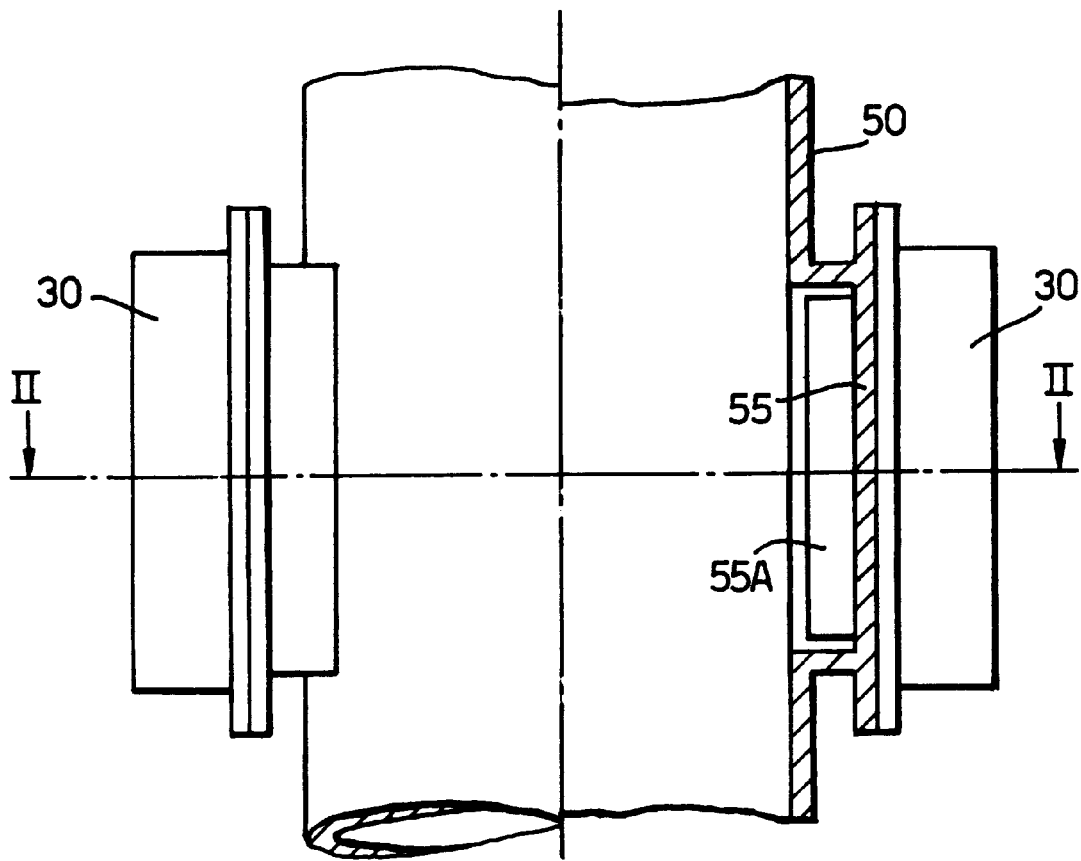
FIG. 2 shows a detailed side view of part of a modified version of FIG. 1 with the tubular element and associated heat sink shown in section on the right side thereof.
Figure 3:
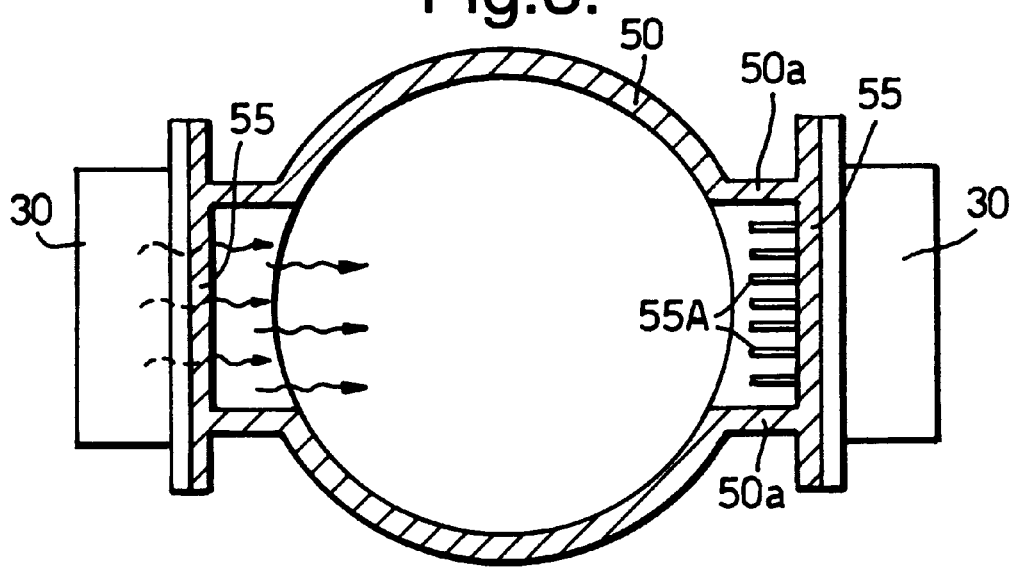
FIG. 3 shows a sectional view on line II—II on FIG. 2.

In the modified arrangement shown in FIGS. 2, 3 each heat sink 55 is welded or otherwise attached to axially and radially extending projections 50a integral with the wall of the element 50.

As indicated above, the tubular element 50 is mounted for limited axial movement in casing 11. This requires the presence of appropriate sealing arrangements to prevent leaking of water from the exterior into the interior of the casing 11.

In FIG. 1 only the sealing arrangement for the upper part of the tube 50 is shown, but a similar arrangement is provided for the lower part of the tube 50 where it exits the lower shell-half 13.

As shown, the upper half-shell 12 has affixed thereto, as by welding, and after element 50 has been inserted into casing 10, a cylindrical element 60 formed with a bore 61 and a circumferential annular flange 62. Above element 60 is arranged a further cylindrical element 63 also formed with a cylindrical bore 64 and a circumferential annular flange 65. The cylindrical bores 61, 64 are aligned whereby the tubular element 50 can pass therethrough and the flanges 62, 65 are positioned with respective surfaces 66, 67 thereof abutting. Sealing means are provided between the tubular element 50 and one or both of the cylindrical bores 61, 64. As shown the cylindrical bores are formed with respective channel section annular grooves 68, 69 adapted to receive respective O-ring seals 70, 71, the seal 70 acting as a primary seal and the seal 71 acting as a back-up seal.

At least one of the abutting surfaces 66, 67 also incorporates sealing means and, as shown, surface 67 is formed with a channel section groove 72 receiving an O-ring seal 73, which also acts as a back-up seal.

As indicated above, the tube 50 is mounted for limited axial movement in the casing 11. Shock absorbing means are provided to prevent damage to the equipment during such movement. As shown, the shock absorbing means comprises a ring 80 welded or otherwise fixed on the external surface of the tube 50 and adapted to engage or almost engage surface 75 of element 60 on upward movement, the ring 80 and/or the surface 75 having resilient means 81 associated therewith to control the final movement of the tube 50. Such resilient means may comprise one or more compression springs or buffer elements formed of elastomeric material. It is also envisaged that the ring 80 itself is formed of elastomeric material, or as a spring washer or as collapsible material.

A similar shock absorbing means is provided at the lower region of tube 50.

By virtue of the described arrangement heat is conducted to both the exterior casing wall 90 and to the wall 91 of the passage provided by element 50 extending through the casing whereby heat produced in the equipment is dissipated to the surrounding water.

Under certain circumstances the gas in the casing 11 may be replaced by a liquid. Circulation of the gas or liquid within the casing may involve natural circulation only or additionally or alternatively may utilise a degree of forced circulation as by means of a fan or pump.

Figure 4:
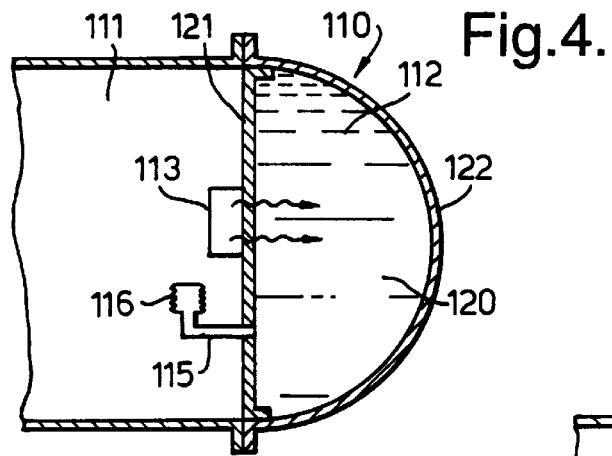
FIGS. 4–9 of the accompanying drawings diagrammatically illustrate respective other examples of power equipment in accordance with the invention.

In the embodiment of FIG. 4, power equipment comprises a pressure vessel 110 having a chamber 111 incorporating the heat-producing power devices and a chamber 112 at least partially filled with liquid 120, e.g. water, methyl alcohol or a proprietary refrigerant. The chamber 112 has a wall 121, which may be arranged vertically, horizontally or at any angle as required and a dome-shaped element 122 affixed to or integral with the wall 121. The chamber 112 is shown as constituting the right hand end of the pressure vessel there may be a similar chamber at the left hand end of the vessel.

Adjacent to or, at the least, in heat-conducting relationship with the wall 121 there is arranged the heat producing power device(s) 113 of the power equipment which will for example comprise a prime mover, e.g. an engine and/or transmission equipment, e.g. of mechanical, electrical, hydraulic, pneumatic form. The device(s) may, if appropriate, be mounted on to wall 121. Heat from the heat source is conducted through wall 121 to the liquid 120 in chamber 112. The heat is conducted through liquid 120, and will be dissipated into the surrounding water. There will of course be a degree of natural circulation of the liquid within the chamber 112 associated with the heat transfer and it is particularly envisaged that the equipment will operate with natural circulation only. However, the chamber 112 may incorporate a forced circulation means, e.g. a pump or swirler, and a magnetic swirler arrangement may be appropriate since this requires no outside connection.

To assist transfer of heat to the surrounding water and to increase the area available for such transfer the domed element 122 may be formed with ribs, vanes or corrugations.

Attached to the chamber 112 via a conduit 115 is a compensator 116, e.g. including a bellows; should there be heat-induced expansion of the liquid to a volume greater than that of the chamber 112, liquid may flow to the compensator 116 and, on the other hand, the volume enclosed by bellows 116 constitutes a reservoir of liquid for the chamber 112.

Figure 5:
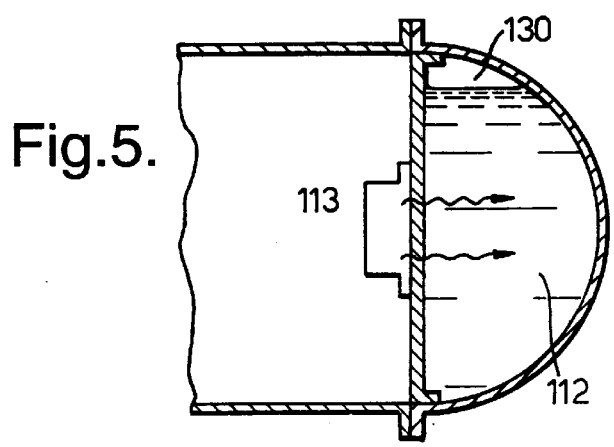

The embodiment of FIG. 5 differs from that of FIG. 4 in that no compensator is provided and it is arranged that the chamber 112 is only partially filled with liquid. In consequence, a volume 130 devoid of liquid is formed at the upper part of the chamber 112 and in taking up heat from the heat source, the liquid is able to boil and form a vapour in volume 130.

The vapour will assist in heat transfer to the outside water and the latent heat required to turn the liquid into vapour in the first place will give efficient and effective heat transfer, the vaporised liquid will condense on the surface of the volume of the domed element. The embodiment of FIG. 6 effectively constitutes a modification of the embodiment of FIG. 5, in which the volume 130 above the heat transfer liquid is connected to an evacuating pump (not shown) which will ensure that the volume 130 is put under very low pressure, (e.g. of the order of 30 mm Hg absolute) whereby the temperature at which liquid 120 boils is reduced, where the pressure is 30 mm Hg, then water in the chamber will boil at approximately 30° C. The evacuating pump is connected to volume 130 via a line 140 incorporating a valve 141.

Figure 6:
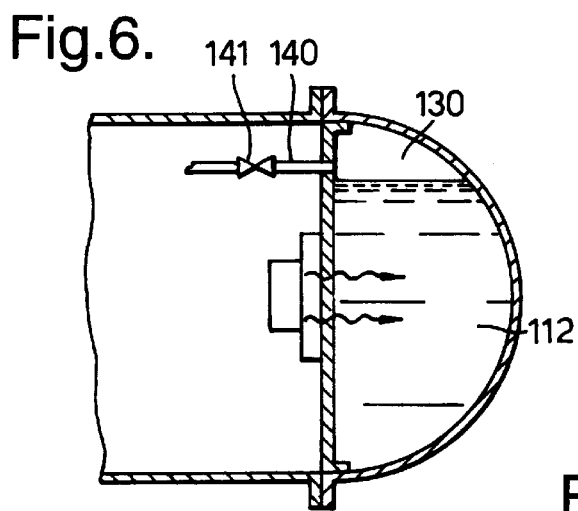
Figure 7:
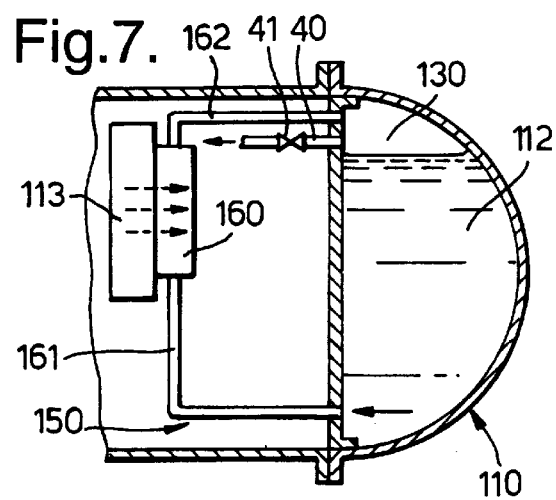

The embodiment of FIG. 7 incorporates the evacuation line 140 of FIG. 6 but, in addition, a circulating arrangement 150 is provided whereby liquid from the chamber 112 is circulated through a heat exchanger 160. The heat exchanger 160 will be mounted adjacent to or at least in heat conducting relationship with the heat producing power device 113 and liquid is caused to flow via lines 161, 162 from a lower region of the chamber 111 through the heat exchanger 160 and into the volume 130 at the top of the chamber; in the heat exchanger nucleate boiling will occur because of the low pressure in volume 130.

Figure 8:
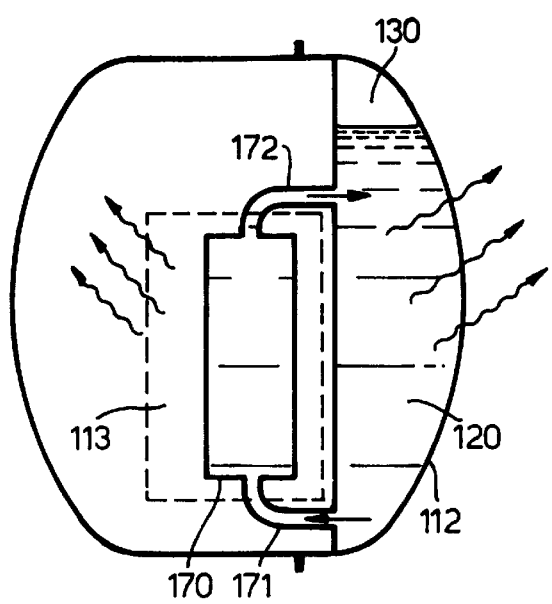

In the embodiment of FIG. 8, lines 171, 172 are connected between the chamber 112 and a heat exchanger 170, but the upper line 172 connects with an upper region of the liquid 120 rather than with the reduced pressure volume 130.

Figure 9:
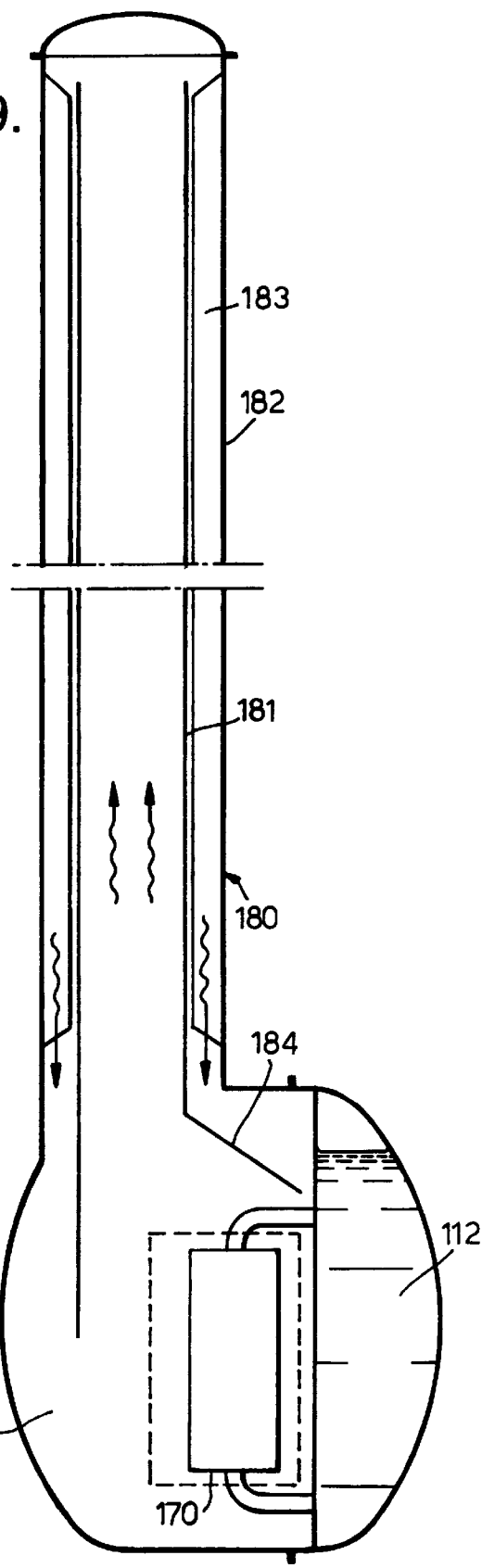

FIG. 9 represents a modification of the FIG. 8 embodiment wherein an additional heat exchange arrangement 180 is associated with the heat exchanger 170, the arrangement 180 comprising an inner tube 181 and an outer tube 182 with an annular passage 183 formed therebetween. Both tubes are closed at their upper ends. At its lower end the inner tube 181 is attached to widened flue 184 which is located above and at least partially surrounding the heat exchanger 170. The pressure vessel chamber 111 has a volume for containing a fluid, usually gas (e.g. air, or nitrogen under pressure) and in operation it is heated as it passes over heat exchanger 170 and then passes up the inner tube 181 and down the annular passage 183 to dissipate heat to the surrounding water. One or both tubes 182, 183 may be finned on one or more surfaces to assist heat disposal. Circulation of the air through the tubes may be natural or be forced, e.g. by a fan.

We claim:

1. Power equipment for use when submerged in water, the power equipment comprising an exterior casing enclosing at least one power device of a type which produces heat when in use, the exterior casing being in heat exchange relationship with the at least one power device so as to put the at least one power device into heat exchange relationship with water surrounding the exterior casing when the power equipment is submerged, the power equipment further comprising a passage penetrating the exterior casing and extending at least partially through the power equipment in heat exchange relationship with the at least one power device, which passage is open to ingress of the water surrounding the exterior casing so as to put the at least one power device into heat exchange relationship with water in the passage when the power equipment is submerged.

2. Power equipment as claimed in claim 1 wherein the passage is provided by a substantially tubular element extending through the casing, which passage is open at at least one end.

3. Power equipment as claimed in claim 2 wherein the substantially tubular element is of circular cylindrical form and is open at both ends.

4. Power equipment as claimed in claim 2 wherein the substantially tubular element is mounted for limited axial movement in the casing.

5. Power equipment as claimed in claim 4 wherein shock absorbing means are provided to restrain movement of the substantially tubular element.

6. Power equipment as claimed in claim 1 wherein at least one heat sink is mounted in the casing adjacent to the passage to take up heat by conduction from within the casing.

7. Power equipment as claimed in claim 2, wherein a heat sink is provided to discharge heat to the surrounding water, the heat sink being mounted on one of the tubular element and the casing.

8. Power equipment as claimed in claim 1, wherein said casing incorporates at least one array of cooling vanes to take up convection heat.

9. Power equipment as claimed in claim 2, wherein an array of cooling vanes is attached to said tubular element to take up convection heat.

10. Power equipment as claimed in claim 8, wherein a said array of cooling vanes is mounted on the inner surface of the casing.

11. Power equipment as claimed in claim 1 wherein the casing contains a fluid which, in use, circulates therein by at least one of natural circulation and forced circulation.

12. Power equipment for use underwater, the power equipment comprising a pressure vessel having a first chamber in which is mounted at least one power device which produces heat in use and a second chamber at least partially filled with a fluid, the second chamber being in heat conductive relationship with the power device and also having a wall in contact with the water surrounding the power equipment, whereby heat produced by the power device is transmitted to the second chamber and thence transmitted to the surrounding water.

13. Power equipment as claimed in claim 12 wherein the fluid in the second chamber is a liquid.

14. Power equipment as claimed in claim 13 wherein the liquid is water.

15. Power equipment as claimed in claim 13 wherein the second chamber is connected to a volume compensating means such that liquid is able to flow therebetween.

16. Power equipment as claimed in claim 13 wherein the second chamber is only partially filled with liquid and a volume is defined in the second chamber above the liquid.

17. Power equipment as claimed in claim 16 wherein the volume above the liquid is connected to an evacuation means actuatable to reduce the pressure in said volume.

18. Power equipment as claimed in claim 12, wherein the second chamber is connected by conduit means with a heat exchange arrangement which is disposed adjacent the power device.

19. Power equipment as claimed in claim 18 wherein the first chamber has a volume containing a further fluid and the heat exchange arrangement comprises a coaxial-tube arrangement for the flow of said further fluid therethrough.

20. Power equipment as claimed in claim 19, wherein the coaxial-tube arrangement comprises an outer tube extending outwardly from the first chamber and in contact with said surrounding water and an inner tube disposed within the outer tube and terminating at one end within the first chamber near to the power device, said further fluid during use of the power equipment being caused to flow first inside the inner tube and then between the outer and inner tubes.

21. Power equipment as claimed in claim 12, wherein the second chamber has a domed element whose exterior domed surface provides the wall in contact with the surrounding water for the transfer of heat thereto from the fluid in the second chamber.

22. Power equipment as claimed in claim 21 wherein the surface of the domed element in contact with the water is formed at least one of corrugations, vanes and ribs.

23. Power equipment as claimed claim 12, wherein movement of the fluid in the power equipment occurs by at least one of natural circulation and forced circulation.

\* \* \* \* \*